United States Patent [19]

Pringle et al.

[11] 4,005,375
[45] Jan. 25, 1976

[54] DEVICE INCLUDING FERRIMAGNETIC COUPLING ELEMENT

[75] Inventors: Robert D. Pringle; Ian F. Morton, both of Edinburgh, Scotland

[73] Assignee: Microwave and Electronic Systems Ltd., Newbridge, Scotland

[22] Filed: Dec. 9, 1974

[21] Appl. No.: 531,124

[30] Foreign Application Priority Data
Dec. 7, 1973 United Kingdom ............ 56944/73

[52] U.S. Cl. ........................... 333/21 R; 333/84 M
[51] Int. Cl.² ..................... H01P 1/16; H01P 5/00; H01P 5/08
[58] Field of Search ............... 333/1.1, 24.1, 24.2, 333/73 S, 84 R, 84 M, 21 R

[56] References Cited
UNITED STATES PATENTS

| | | | |
|---|---|---|---|
| 3,560,893 | 2/1971 | Wen | 333/24.1 |
| 3,594,664 | 7/1971 | Lipetz | 333/1.1 |
| 3,678,395 | 7/1972 | Hunton et al. | 333/84 M X |

*Primary Examiner*—Paul L. Gensler
*Attorney, Agent, or Firm*—Sughrue, Rothwell, Mion, Zinn & Macpeak

[57] ABSTRACT

A radio frequency coupling device has a non-magnetic, dielectric substrate having a planar surface on which a ferrimagnetic disc-shaped film is epitaxially grown. Sections of surface-oriented transmission line such as coplanar waveguide or slot-line extend over the substrate surface and terminate over the disc. The ferrimagnetic material couples to the RF magnetic fields associated with the transmission line sections and provides a coupling therebetween which is tunable by adjusting a direct magnetic field applied to the disc. Low direct coupling between the sections is obtained by arranging their respective RF magnetic fields to be orthogonal at the disc.

16 Claims, 4 Drawing Figures

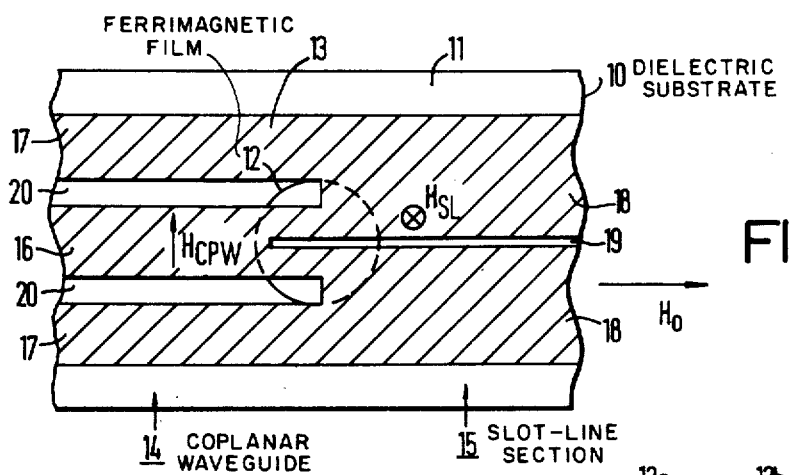
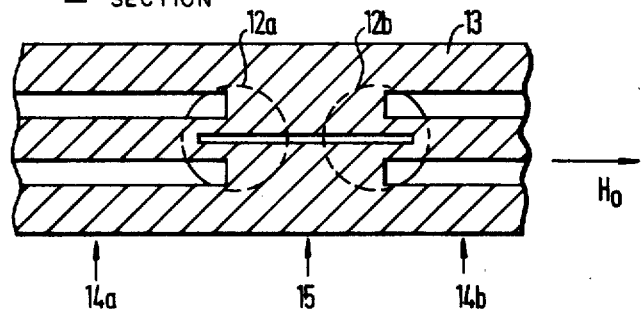
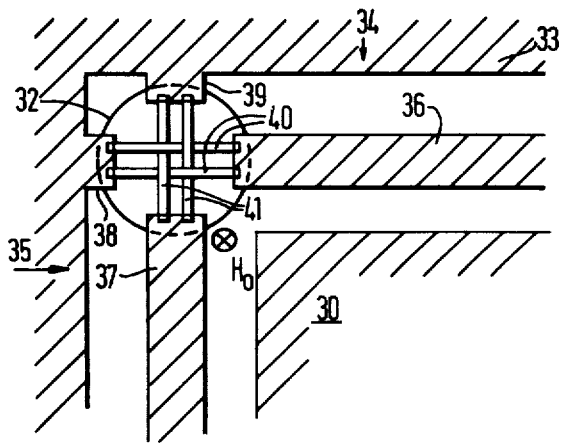
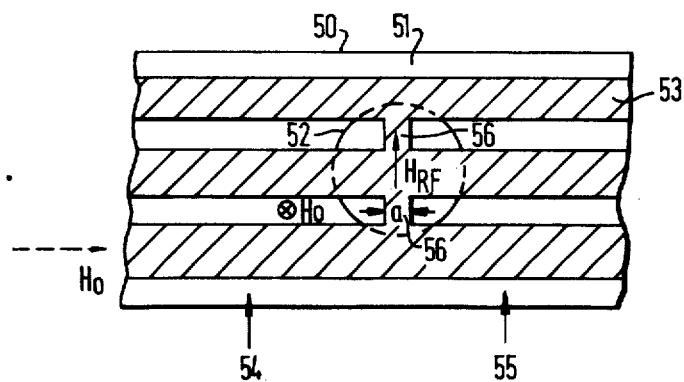

DEVICE INCLUDING FERRIMAGNETIC COUPLING ELEMENT

BACKGROUND TO THE INVENTION

This invention relates to a radio frequency coupling device including a ferrimagnetic coupling element.

A particular, though not exclusive, application of the invention is to microwave tunable filters and limiters. Tunable microwave filters have been produced in which radio frequency power is coupled from one transmission line to another through a magnetised body of ferrimagnetic material commonly called a resonator. When used in a filter, the form of coupling through the body is by uniform spin precession in the ferrimagnetic material about an applied direct magnetic field. The response of the resonator is a function of the applied field as well as the geometry of the body and coupling is obtained in a band centered on the resonant frequency. Thus this form of coupling is not only frequency selective but is tunable by changing the applied bias field.

It is also known that the ferrimagnetic resonator coupling falls above certain input power level at which uniform spin precession begins to breakdown. It is, therefore, possible to make limiters based on this effect.

Initially resonators of the above kind were ferrimagnetic spheres, the ferrimagnetic material being Yttrium Iron Garnet (YIG). Subsequently YIG discs were used and more recently the use of epitaxially grown YIG films has been investigated, the film being formed to a disc shape.

SUMMARY OF THE INVENTION

The present invention is generally concerned with a device which uses a ferrimagnetic film as a coupling element. The general concept of the invention is to provide a coupling between two transmission lines which are of the kind that will be referred to herein as a surface-oriented transmission line, the coupling being made through a ferrimagnetic film.

A surface-oriented transmission line is one in which the line conductors lie at a common surface of a dielectric which surface is normally planar. Examples of such lines are coplanar waveguide (CPW) in which a centre conductor is flanked by two outer ground plane conductors all formed on the planar surface of a dielectric substrate (in some CPW only one ground plane conductor is used), and slot-line which comprises two spaced parallel conductors formed on the surface of a dielectric substrate with a relatively narrow slot between them. These line types are well known and may be contrasted with two other well known line types which have conductors formed on a substrate namely microstrip and strip-line which have a conductor-dielectric-conductor sandwich kind of structure. These latter types of line thus have conductors on opposite sides of a dielectric body instead of lying at one common surface of the body.

According to the present invention there is provided a radio frequency coupling device comprising a nonmagnetic, dielectric substrate, a ferrimagnetic film supported on a surface of the substrate, and first and second surface-oriented transmission lines formed on said substrate surface and having respective portions thereof overlying said ferrimagnetic film for coupling by the ferrimagnetic material.

Preferably the ferrimagnetic film is formed by epitaxial deposition on the substrate to provide a single crystal coupling medium. The film is normally of a disc shape which may be formed by selective etching. Devices embodying the invention have the advantage that only a single surface of the substrate is involved in providing a coupling between two lines.

Couplings of the kind defined may be provided between CPW sections, slot-line sections or CPW and slot-line sections, all of which have particular application at microwave frequencies. It is possible to couple transmission lines which are in alignment or at right angles by use of appropriate conductor configurations and terminations at the ferrimagnetic film. In addition a number of such couplings may be provided in series, all on a single substrate, where by controlling the frequency response at each coupling, filters and other frequency-responsive devices can be made. In order that the ferrimagnetic film can perform as required it needs to have a biassing direct magnetic field applied to it and this field should be directed perpendicular to the RF magnetic field direction associated with each of the two lines which are coupled via the film.

The conductors are normally formed as a thin layer of metallisation and thus can provide a close physical contact with the surface of the ferrimagnetic film ensuring close coupling. It is not necessary to have complete coupling turns but only that a portion of a radio frequency energy-carrying conductor should couple to the ferrimagnetic material. It is the RF magnetic field component which couples to the film material. One form of line termination at the film which may be conveniently used to produce the strong desired RF magnetic field is a short-circuit termination. Such short-circuit terminations are readily provided for surface-oriented lines by a transverse bridging conductor portion. However, the termination can be realised in other ways as will be apparent from the following more detailed description of various devices embodying the invention.

BRIEF DESCRIPTION OF THE DRAWINGS

In order that the invention may be better understood embodiments of it will now be described, by way of example only, with reference to the accompanying drawing in which:

FIG. 1 shows a diagrammatic plan view of a device having a coplanar waveguide to slot-line coupling;

FIG. 2 shows a modification of the device of FIG. 1 to provide coupling between two coplanar waveguide sections via a slot-line section;

FIG. 3 shows a diagrammatic plan view of a device incorporating a coupling between two coplanar waveguide sections; and FIG. 4 shows a like view of another device having a coupling between two coplanar waveguide sections.

In the figures metallisation has been shaded to assist in distinguishing it from other parts of the illustrated devices.

DESCRIPTION OF THE PREFERRED EMBODIMENTS

The device of FIG. 1 includes a coupling between two surface-oriented lines which may, of course, form part of a more extensive microwave circuit. More specifically FIG. 1 shows a plan view of a substrate 10 having a planar surface 11 at which a single crystal (mono-crystalline) ferrimagnetic film is formed as a disc 12. A longitudinal layer of patterned metallisation 13 overlies the surface 11 and the disc 12. The metallisation is formed as a coplanar waveguide (CPW) section 14 at the left-hand side (as seen in the drawing) and as a slot-line section 15 at the right-hand side, the two sections being in axial alignment. The two sections extend over the surface of the substrate 10 and end portions thereof extend onto and overlie the disc 12. In the embodiment shown these end portions which provide terminations coupling to the disc 12 overlap at the ferrimagnetic disc 12 which provides a coupling medium between the two sections in a manner to be described later. The disc 12 and the overlying metallisation 13 are both thin and can be considered for the purposes of this description as lying in a common plane at the surface of the substrate. For convenience this plane will be referred to as the surface plane.

The substrate 10 has to be non-magnetic to support the ferrimagnetic disc 12 and dielectric to support the conductors of the surface-oriented transmission line sections 14 and 15. CPW section 14 has a centre conductor 16 flanked by two parallel outer conductors 17 spaced therefrom while the slot-line section 15 has the two parallel conductors 18 spaced by the slot 19 which penetrates the centre conductor 16 of the CPW section and thus overlaps the slots 20 of the CPW section at the ferrimagnetic disc 12.

The disc 12 is conveniently of single crystal Yttrium Iron Garnet (YIG) preferably formed by epitaxial deposition on the substrate 10. A suitable substrate material for this epitaxial growth is Gallium Gadolinium Garnet (GGG) which is also a dielectric suitable for the transmission line sections 14 and 15. It will be noted that all the structure is formed on the one surface 11. There is no need for separate ground plane metallisation on the opposite side of the substrate 10.

To couple the sections 14 and 15 it is necessary to apply a biassing direct magnetic field Ho to the disc 12. If the CPW section 14 is excited, the radio frequency magnetic field $H_{CPW}$ at the disc associated with the CPW section is in the surface plane of the perpendicular to the line axis as indicated by the arrow; the RF magnetic field $H_{SL}$ associated with the slot-line section is generated by the uniform precession in the disc and is normal to the plane of the metallisation as indicated by the cross. In order that both fields $H_{CPW}$ and $H_{SL}$ can couple to the ferrimagnetic material of disc 12, the applied bias field Ho has to be perpendicular to both thus requiring the field to be applied in the surface plane and in the direction of the longitudinal axis. The means for providing the field Ho which is uniform throughout the disc 12 is not shown but may use a permanent magnet or a solenoid to generate the required field. A typical size for the disc is 0.5–5.0 mm. It will be appreciated that transmission through the described coupling is reciprocal.

Thd disc 12 acts as a resonator the resonant frequency of which is determined by the dimensions of the disc and the value of the bias field Ho. Coupling between line sections 14 and 15 is by uniform spin precession in the ferrimagnetic material about the bias field Ho. The bandwidth of operation is a function of the tightness of coupling of the transmission lines to the ferrimagnetic disc. For the purpose it is to be noted that no complete coupling loop (i.e., a complete turn) is necessary. It is sufficient to have the conductors run in the close vicinity of the disc and it will be appreciated that the use of surface-oriented transmission lines which closely overlie the disc is a distinct advantage in this respect. Because the RF magnetic fields associated with line sections 14 and 15 are perpendicular, the direct coupling between the lines is small.

It should be noted that the degree of overlap of the lines is a variable parameter and in fact it is not essential that the slots interpenetrate in the manner shown in FIG. 1. In practice the overlap is chosen to give the best balance between low loss on resonance (of the disc) and high isolation off resonance.

FIG. 2 shows a modification of the device of FIG. 1 which in effect is two couplings of the kind shown in FIG. 1 connected in series back-to-back. The dielectric substrate has been omitted from the drawing but underlies the whole of what is shown. As shown two CPW sections 14a and 14b are coupled through a slot-line section 15, the ends of the slot-line section overlapping respective ones of the CPW sections over ferrimagnetic discs 12a and 12b respectively. Thus at each disc coupling between the slot-line and CPW sections is as described above.

It would, of course, be possible to produce the inverse structure in which two slot-line sections are coupled via a CPW section. In each case the exact size of the lines relative to each other and of the discs is a selectable design parameter as is the extent of overlap of the CPW and slot-line sections. Because the FIG. 2 device includes two resonators 12a and 12b there is greater scope for tailoring the frequency response of the device.

FIG. 3 illustrates yet another device embodying the invention, in this case the device having a coupling between two CPW sections running at right angles to one another. The figure shows a portion of a larger circuit formed on the planar surface of a substrate 30 of dielectric, non-magnetic material such as GGG. A single crystal ferrimagnetic disc 32 of YIG, for example, is formed at the substrate surface by epitaxial deposition and selective etching. The disc is located at the intersection of two CPW sections defined by metallisation 33 (shown shaded) of the substrate surface. The two sections 34 and 35 run perpendicularly and have centre conductors 36 and 37 respectively which overlap at the disc 32, each centre conductor being shorted to the ground plane metallisation by stubs 38 and 39 respectively.

It will be noted, however, that over the disc the full width of the centre conductors is broken and connection is made by a plurality of parallel narrower conductors 40 and 41 associated with centre conductors 36 and 37 respectively. In this case just two narrower conductors are shown for each centre conductor though more could be used. The narrower conductors of one set 40 are interwoven with those of the other set. Each conductor crosses successive conductors of the other set alternately below and above. The interwoven conductors are bonded to the surface of the disc 32 so as to achieve a close coupling with the ferrimagnetic material. It is found that by using a plurality of narrower conductors, an increased coupling to the disc is achieved. However, it is possible to simply cross the full-width conductors over the disc making due provision to insulate them from each other.

Insulation of the conductors 40, 41 from one another can be realised by using fine insulated wire of circular cross-section or insulated wire tape. The ends of the conductors are bonded electrically to the main centre conductors 36, 37 and short-circuit stubs 38, 39 as by thermocompression bonding or ultrasonic gold wire bonding. The conductors 40 and 41 should be kept as short as possible.

Alternatively the conductors 40, 41 can be part of the metallisation 33 with due provision of insulation at the cross-overs as by depositing a metal-insulator-metal sequence.

The coplanar waveguide sections may have ground plane conductors on one side only of the "centre" conductor. In this case the inner area 30 of metallisation could be omitted. The sizes of the disc and the relative size of the lines is selectable in accordance with the desired device characteristics.

In operation the sections of CPW have mutually orthogonally radio frequency magnetic fields associated therewith both of which lie in the surface plane. Thus direct coupling between the sections is small as before, a direct bias magnetic field is required for the ferrimagnetic disc and has to be perpendicular to both the RF magnetic fields. This requires the bias field Ho indicated by the cross to be applied normal to the substrate, i.e. normal to the plane of the drawing.

FIG. 4 shows a device in which two CPW sections are coupled via a single ferrimagnetic disc. In the figure, a substrate 50 has a planar surface 51 on which is formed a single crystal ferrimagnetic disc 52. As before the disc and substrate can be of YIG and GGG respectively. Overlaying the surface 51 and the disc 52 is a patterned layer of metallisation 53 comprising three parallel spaced-apart areas of metallisation, which define two axially-aligned CPW sections 54 and 55, and two transverse areas 56 which terminate in the CPW sections in a common short-circuit. As seen from the figure, the short-circuit terminated end portions of CPW sections 54 and 55 lie over the disc 52.

In operation, assuming the disc 52 is appropriately magnetically biased the two CPW sections 54 and 55 are coupled via the disc resonator. The short-circuit termination 56 causes propagation in each CPW section to produce a field $H_{RF}$ at the disc 52 which is in the plane of the disc and perpendicular to the axis of propagation as indicated by the arrow. An applied direct bias field Ho normal to the plane of the disc will allow coupling of the ferrimagnetic material to the RF magnetic field. Because both fields $H_{RF}$ lie in the same direction in this case, there are two possible directions for the perpendicularly applied field Ho, the second being indicated by the dashed arrow in the surface plane.

The disc 52 is resonant at a frequency dependent on the applied bias field Ho and provides coupling between the CPW sections over a band centred on this resonant frequency. The width $a$ of the short 56 is in fact very small of the order of 50 μm. and such a short is known as a hair-line short.

The short-circuit width "$a$" is adjustable to provide the required degree of isolation between the CPW sections, i.e., to minimise the direct coupling which by-passes the disc 12, since in this embodiment the two RF magnetic fields are in the same direction. The dimensions of the disc, the metallisation areas and the CPW sections are all adjustable design parameters.

What is claimed is:

1. A radio frequency coupling device comprising a non-magnetic, dielectric, single crystal substrate; a film of single crystal ferrimagnetic material epitaxial with said substrate and located at a substrate surface essentially co-planar therewith; first and second surface-oriented transmission line sections formed on said substrate surface and having respective end portions thereof overlying said ferrimagnetic film, said film of ferrimagnetic material when subjected to a biasing direct magnetic field serving to couple the magnetic fields of such first and second surface-oriented transmission line sections, said end portions being terminated to present an RF discontinuity therebetween which prevents significant mutual coupling directly between said first and second transmission line sections, and said end portions cooperating with said ferrimagnetic film in the presence of said biasing magnetic field to couple thereto and establish a reciprocal RF coupling between said first and second transmission line sections at a frequency dependent on said biasing magnetic field.

2. A device as claimed in claim 1 in which said film is a disc of Yttrium Iron Garnet and said substrate is of Gallium Gadolinium Garnet.

3. A device as claimed in claim 1 in which said end portion of each of said first and second transmission line sections includes an RF short-circuit termination overlying said film.

4. A device as claimed in claim 3 in which each of said first and second transmission line sections is of coplanar waveguide form, the sections being in alignment and said termination of said end portions thereof comprises a transverse conductor portion providing a common hair-line short circuit.

5. A device as claimed in claim 1 in which said end portions are oriented such that the respective RF magnetic field directions associated with said end portions of said transmission line sections are mutually orthogonal.

6. A device as claimed in claim 5 in which said first and second transmission line sections are in alignment, said first section being of coplanar waveguide form and said second section being of slot-line form.

7. A device as claimed in claim 6 in which said end portions of said first and second transmission line sections interpenetrate one another.

8. A device as claimed in claim 5 in which said first and second transmission line sections are of the same form and said end portions thereof are at right angles to one another.

9. A device as claimed in claim 8 in which said first and second transmission line sections are of coplanar waveguide form.

10. A device as claimed in claim 8 in which each of said first and second transmission line sections is of coplanar waveguide form, the respective end portions thereof comprising respective conductor portions insulatedly crossing one another, and each of said end portions including an RF short-circuit termination.

11. A device as claimed in claim 10 in which each of said conductor portions comprises a plurality of parallel conductors, the parallel conductors of one conductor portion being interwoven with those of the other.

12. A radio frequency coupling device comprising a non-magnetic, dielectric, single crystal substrate; a film of single crystal ferrimagnetic material epitaxial with said substrate and disposed at a portion of a surface of said substrate essentially coplanar therewith; a layer of patterned metallisation overlying said substrate surface and said film, said metallisation being patterned to define a first surface-oriented transmission line section partially extending over said substrate surface and having a terminating portion overlying said film, and a second surface-oriented transmission line section partially extending over said substrate surface and having a terminating portion overlying said film, an RF discontinuity existing between said terminating portions to prevent significant mutal coupling directly therebetween; said ferrimagnetic film when subjected to a biasing direct magnetic field serving to establish a reciprocal RF coupling through said film between said terminating portions of said transmission line sections at a frequency dependent on said biasing magnetic field.

13. A device as claimed in claim 12 in which said layer of metallization is patterned to form three spaced-apart, parallel areas of metallization and two areas of metallization overlying said film and providing an RF short-circuit between said three parallel areas, the portion of said three parallel areas to one side of said short-circuit defining said first transmission line section and the portion of said three parallel areas to the other side of said short circuit defining said second transmission line section.

14. A device as claimed in claim 12 in which said first transmission line section comprises three parallel, spaced-apart areas of said metallization defining a section of coplanar waveguide, and said second transmission line section comprises an area of said metallization integral with said three areas of said first transmission line section and having a slot extending therethrough to define a section of slot-line.

15. A device as claimed in claim 14 in which said slot of the second transmission line section is in alignment with the centre elongate area of said first transmission line section.

16. A device as claimed in claim 15 wherein said slot penetrates into said centre area.

* * * * *